United States Patent
Kister et al.

(10) Patent No.: US 11,156,637 B2
(45) Date of Patent: Oct. 26, 2021

(54) ELECTRICAL TEST PROBES HAVING DECOUPLED ELECTRICAL AND MECHANICAL DESIGN

(71) Applicant: FormFactor, Inc., Livermore, CA (US)

(72) Inventors: January Kister, Portola Valley, CA (US); Roy Swart, Hillsboro, OR (US); Edin Sijercic, Portland, OR (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 16/440,468

(22) Filed: Jun. 13, 2019

(65) Prior Publication Data
US 2019/0383857 A1    Dec. 19, 2019

Related U.S. Application Data

(60) Provisional application No. 62/685,232, filed on Jun. 14, 2018.

(51) Int. Cl.
*G01R 1/067* (2006.01)

(52) U.S. Cl.
CPC ..... *G01R 1/06716* (2013.01); *G01R 1/06738* (2013.01)

(58) Field of Classification Search
CPC .. G01R 3/00; G01R 1/06722; G01R 1/06761; G01R 1/07342; G01R 1/07371; G01R 1/07378; H01L 41/47
See application file for complete search history.

(56) References Cited

U.S. PATENT DOCUMENTS

| | | | |
|---|---|---|---|
| 5,175,493 A | 12/1992 | Langgard | |
| 6,163,162 A | 12/2000 | Thiessen | |
| 6,218,910 B1 | 4/2001 | Miller | |
| 6,323,667 B1 | 11/2001 | Kazama | |
| 6,451,712 B1 | 9/2002 | Dalton | |
| 6,615,485 B2 | 9/2003 | Eldridge | |
| 6,655,983 B1 | 12/2003 | Ishikawa | |
| 6,822,467 B2 | 11/2004 | Tervo | |
| 7,279,911 B2 | 10/2007 | Tunaboylu | |
| 7,936,177 B2 | 5/2011 | Breinlinger | |
| 2003/0137316 A1 | 7/2003 | Kazama | |
| 2007/0141877 A1 | 6/2007 | Lee | |
| 2009/0242405 A1* | 10/2009 | Mayer | H01L 29/0673 204/435 |
| 2015/0015289 A1* | 1/2015 | Eldridge | G01R 1/06733 324/754.03 |
| 2016/0118738 A1* | 4/2016 | Nasu | G01R 1/06722 439/700 |
| 2016/0274147 A1* | 9/2016 | Hsu | G01R 1/07378 |
| 2017/0146569 A1* | 5/2017 | Shimizu | G01R 31/2601 |

FOREIGN PATENT DOCUMENTS

WO    WO2010/048971    5/2010

* cited by examiner

*Primary Examiner* — Son T Le
*Assistant Examiner* — Adam S Clarke
(74) *Attorney, Agent, or Firm* — Lumen Patent Firm

(57) ABSTRACT

Probes for testing electrical circuits having decoupled electrical and mechanical design are provided. For example, a mechanically resilient core can be surrounded by an electrically conductive shell. In this way, electrical parameters of the probes are determined by the shells and mechanical parameters of the probes are determined by the cores. An important application of this approach is to provide impedance matched transmission line probes.

15 Claims, 10 Drawing Sheets

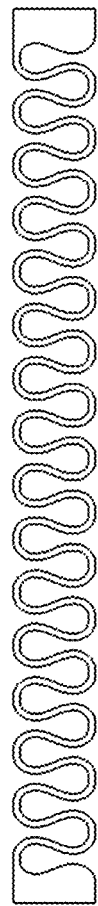 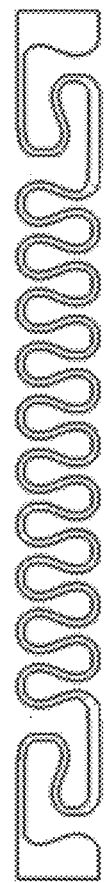 
FIG. 7C
FIG. 7A　　FIG. 7B

ELECTRICAL TEST PROBES HAVING DECOUPLED ELECTRICAL AND MECHANICAL DESIGN

CROSS REFERENCE TO RELATED APPLICATIONS

This application claims the benefit of U.S. provisional patent application 62/685,232, filed on Jun. 14, 2018, and hereby incorporated by reference in its entirety.

FIELD OF THE INVENTION

This invention relates to vertical probes for testing electrical devices.

BACKGROUND

Vertical probes for testing electrical devices and integrated circuits must satisfy both electrical and mechanical design requirements. At higher electrical frequencies (e.g., 5-10 GHz and above) these two sets of requirements come into sharp conflict. Electrical design considerations at these frequencies tend to lead to short probes with highly undesirable mechanical properties, such as overly limited vertical deflection range and high susceptibility to damage from particles.

Accordingly, it would be an advance in the art to provide vertical probes having easier electrical and mechanical design.

SUMMARY

This work addresses this problem by providing probes having decoupled electrical and mechanical design. The basic idea in some embodiments is for each probe to have a core-shell structure, where the core provides the desired mechanical resilience properties, and the shell provides the main electrical current path. The core makes electrical contact (e.g., with sliding electrical contacts) to the shell at the top and bottom of the probe structure to enable the shell to provide this primary current path. In preferred embodiments, this approach can be used to effectively provide a vertical transmission line that can be impedance matched to an input at 50Ω impedance, thereby improving electrical testing performance.

BRIEF DESCRIPTION OF THE DRAWINGS

FIGS. 7A-F show some examples of suitable mechanically resilient cores.

DETAILED DESCRIPTION

Figure 1A:
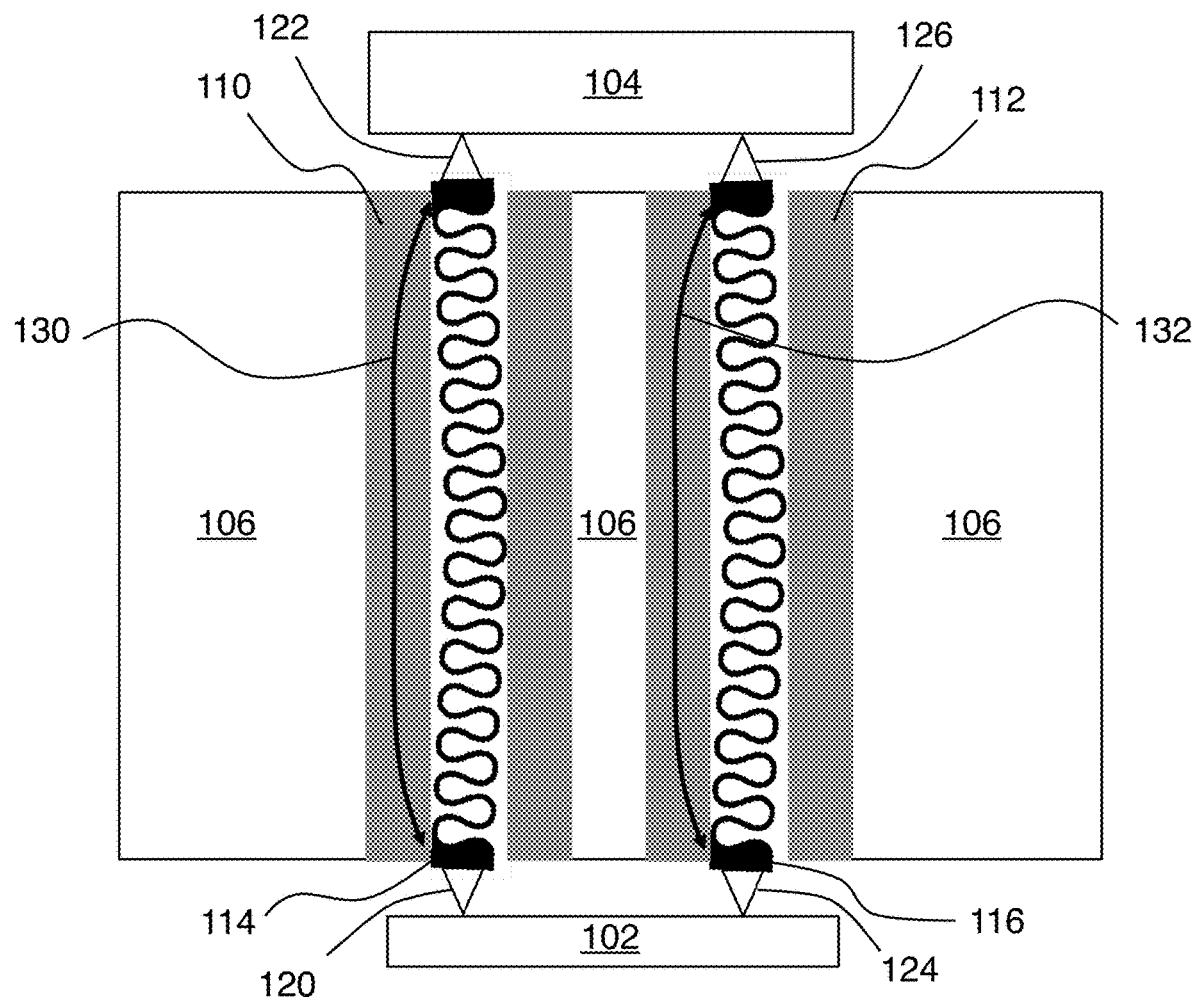
FIG. 1A is a side view of an exemplary embodiment of the invention.
Figure 1B:
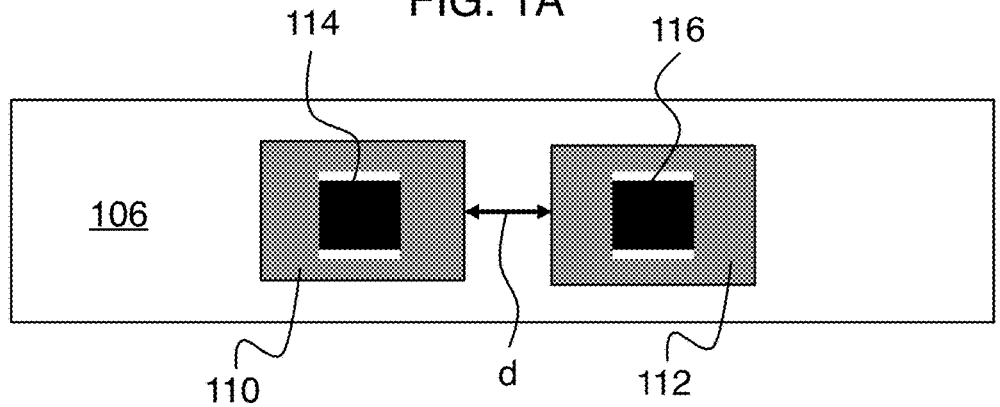
FIG. 1B is a top view of the embodiment of FIG. 1A.

FIG. 1A is a side view of an exemplary embodiment of the invention. FIG. 1B is a top view of the embodiment of FIG. 1A. In this example, two probes of a probe array are shown passing through an electrically insulating guide plate 106 (e.g., SiN, but the composition of guide plate 106 is not critical) are shown. The first probe includes an electrically conductive first member 110 and a mechanically resilient second member 114. In the following description, it will often be convenient to refer to the electrically conductive first member as a 'shell' and to refer to the mechanically resilient second member as a 'core', with the understanding that a core/shell geometry is a preferred embodiment as opposed to a defining feature of the invention.

The first probe also includes a first tip 120 and a second tip 122 disposed at opposite vertical ends of the probe. The first tip 120 is configured to make temporary electrical contact to a device under test 102. The second tip 122 is configured to make electrical contact to a test apparatus 104. An electrical current path 130 between the first tip 120 and the second tip 122 is primarily through the electrically conductive first member 110, as shown. The mechanical compliance between the first tip 120 and the second tip 122 is primarily determined by the mechanically resilient second member 114, also as shown. An important feature of this approach is that the current carrying capacity of the probe is determined by the shell, not by the core, which desirably increases the current carrying capacity.

The second probe includes an electrically conductive first member 112 and a mechanically resilient second member 116. The second probe also includes a first tip 124 and a second tip 126 disposed at opposite vertical ends of the probe. The first tip 124 is configured to make temporary electrical contact to the device under test 102. The second tip 126 is configured to make electrical contact to the test apparatus 104. An electrical current path 132 between the first tip 124 and the second tip 126 is primarily through the electrically conductive first member 112, as shown. The mechanical compliance between the first tip 124 and the second tip 126 is primarily determined by the mechanically resilient second member 116, also as shown.

In preferred embodiments, transmission line impedance of two of the vertical probes is primarily determined according to a distance d between the two probes and according to an effective dielectric constant between the two probes. The transmission line impedance is preferably 50Ω. A key feature here is that this impedance can be made to be substantially independent of the tip to tip length of the probes. In other words, the probes can be as long as necessary for the mechanical design, while still having the desirable electrical properties that can only be obtained with much shorter probes in conventional probe designs. Bandwidth simulations have shown bandwidths >100 GHz for probes having this kind of core-shell architecture.

Figure 2:
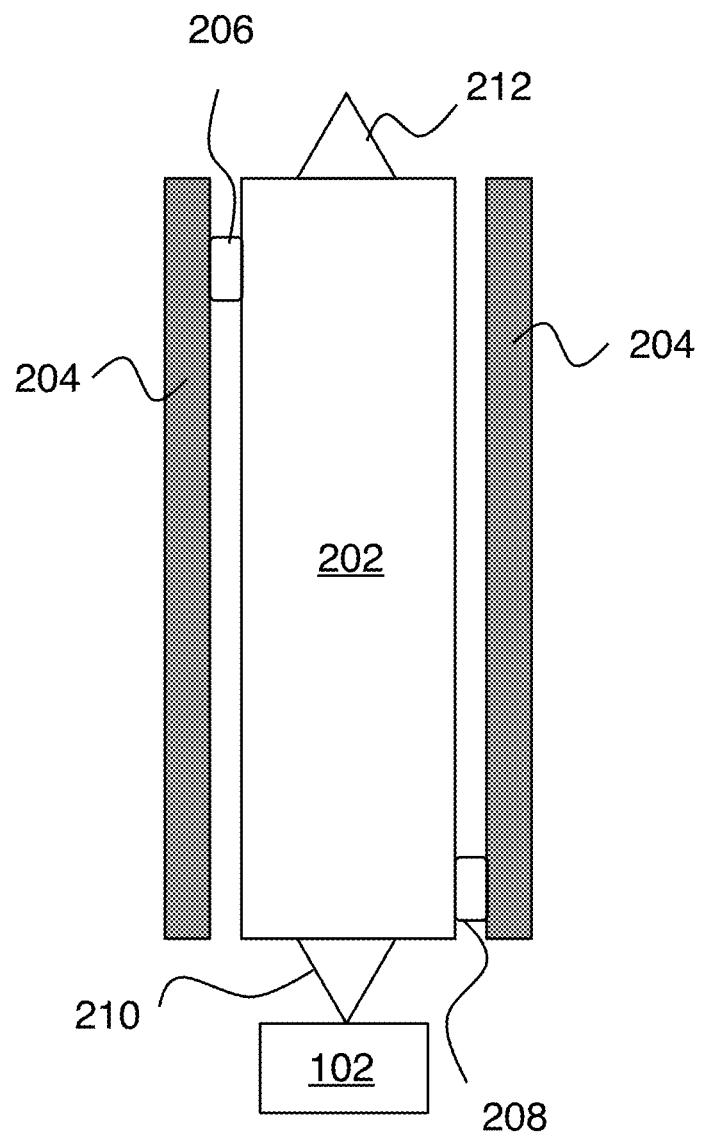
FIGS. 2-4 schematically show several alternative embodiments.
Figure 3:
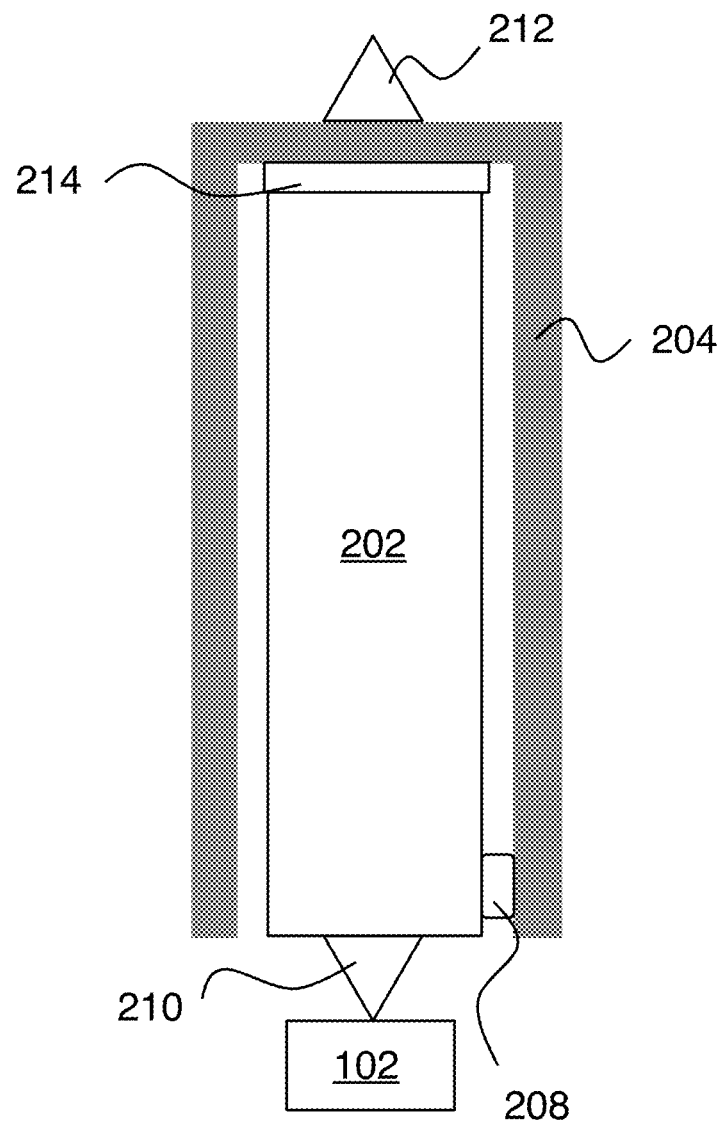
Figure 4:
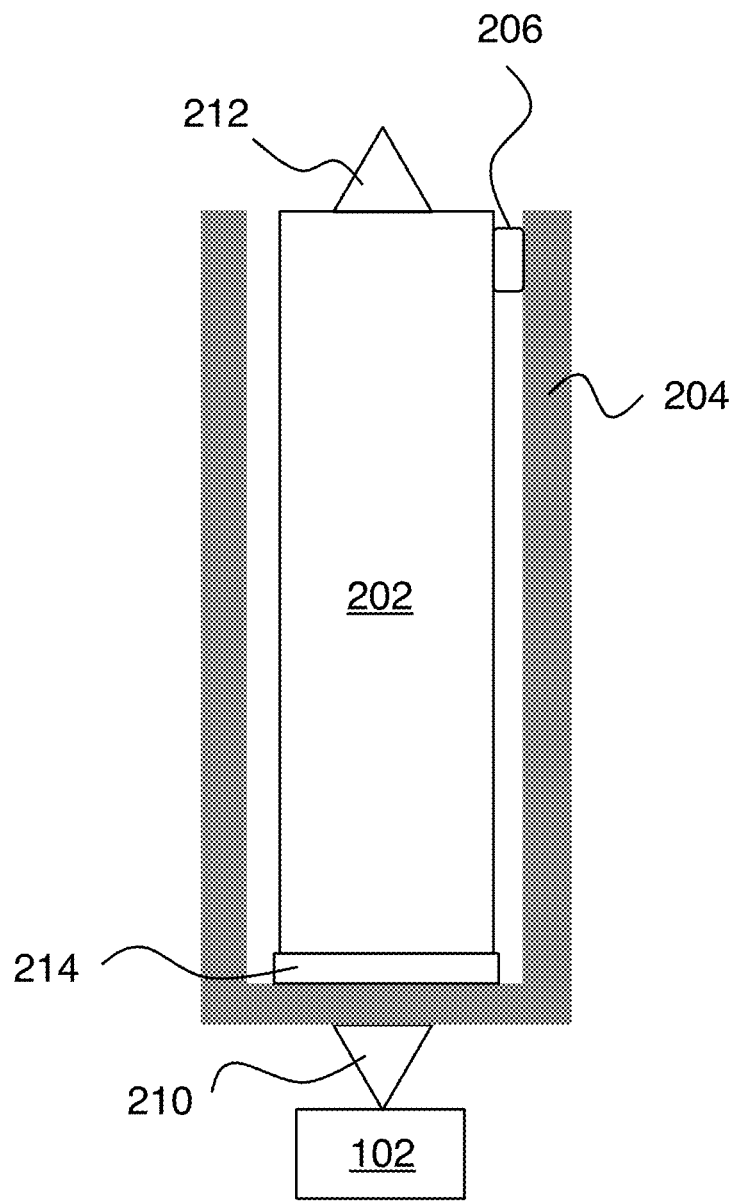

FIGS. 2-4 schematically show several alternative embodiments for single probes, since inclusion in a guide plate as described above is not required in all embodiments of the invention. For example, the insulating guide plate can be omitted if the shells are attached directly to the space transformer.

In the example of FIG. 2, first tip 210 and second tip 212 are disposed on mechanically resilient second member 202. Electrically conductive first member 204 is configured to make a first sliding electrical contact 208 in proximity to the first tip 210. The electrically conductive first member 204 is configured to make a second sliding electrical contact 206 in proximity to the second tip 212. Here the electrically conductive first member is configured as a sleeve where the ends of the mechanically resilient second member stick out of both ends of the sleeve, as shown. This embodiment relies on having a sufficiently low contact resistance in sliding contacts 206 and 208 that the primary current flow path (i.e., 90% or more of the total tip to tip current) is though electrically conductive first member 204.

In the example of FIG. 3, first tip 210 is disposed on mechanically resilient second member 202, and second tip 212 is disposed on electrically conductive first member 204. The electrically conductive first member 204 is configured to make a first sliding electrical contact 208 in proximity to the first tip 210. Preferably, an electrically insulating mechanical connection 214 between the electrically conductive first member 204 and the mechanically resilient second member 202 is disposed in proximity to the second tip 212. This embodiment can provide a more complete confinement of current flow through the electrically conductive first member 204 because there is no competing direct current path through the mechanically resilient second member 202 from end to end.

In the example of FIG. 4, second tip 212 is disposed on mechanically resilient second member 202, and first tip 210 is disposed on electrically conductive first member 204. The electrically conductive first member 204 is configured to make a second sliding electrical contact 206 in proximity to the second tip 212. Preferably, an electrically insulating mechanical connection 214 between the electrically conductive first member 204 and the mechanically resilient second member 202 is disposed in proximity to the first tip 210. This embodiment can provide a more complete confinement of current flow through the electrically conductive first member 204 because there is no competing direct current path through the mechanically resilient second member 202 from end to end. From these example, it is clear that practice of the invention does not depend critically on which parts of the probe tips are attached to.

Figure 5A:
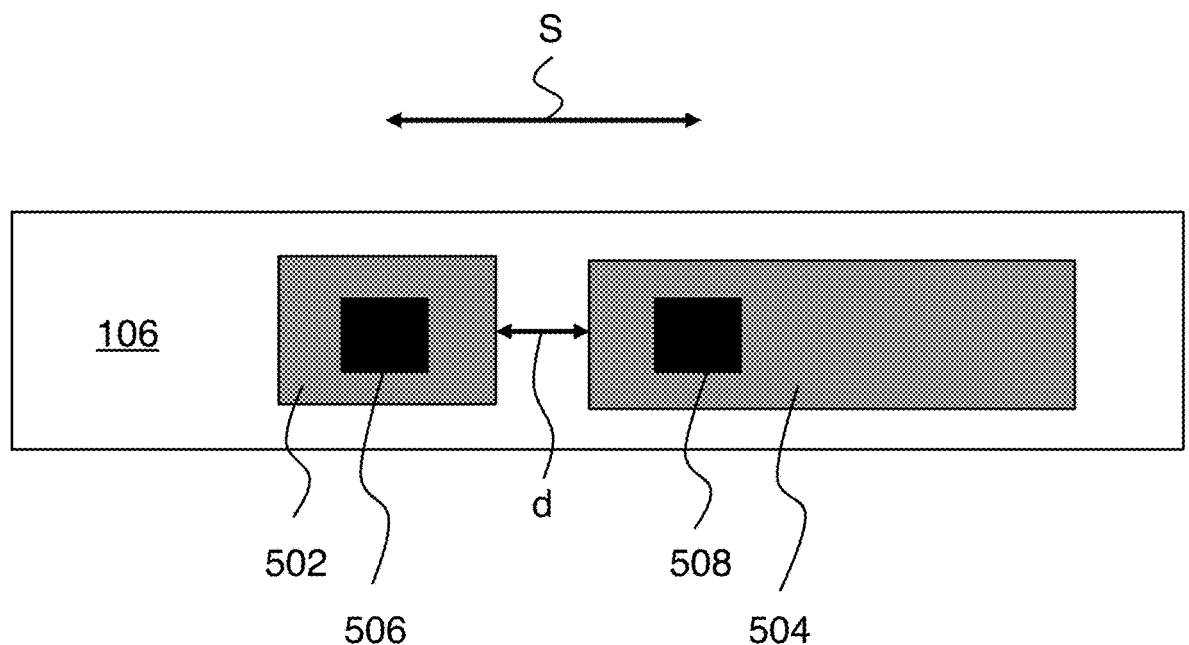
FIGS. 5A-B show how embodiments of the invention can decouple electrical design from probe spacing.
Figure 5B:
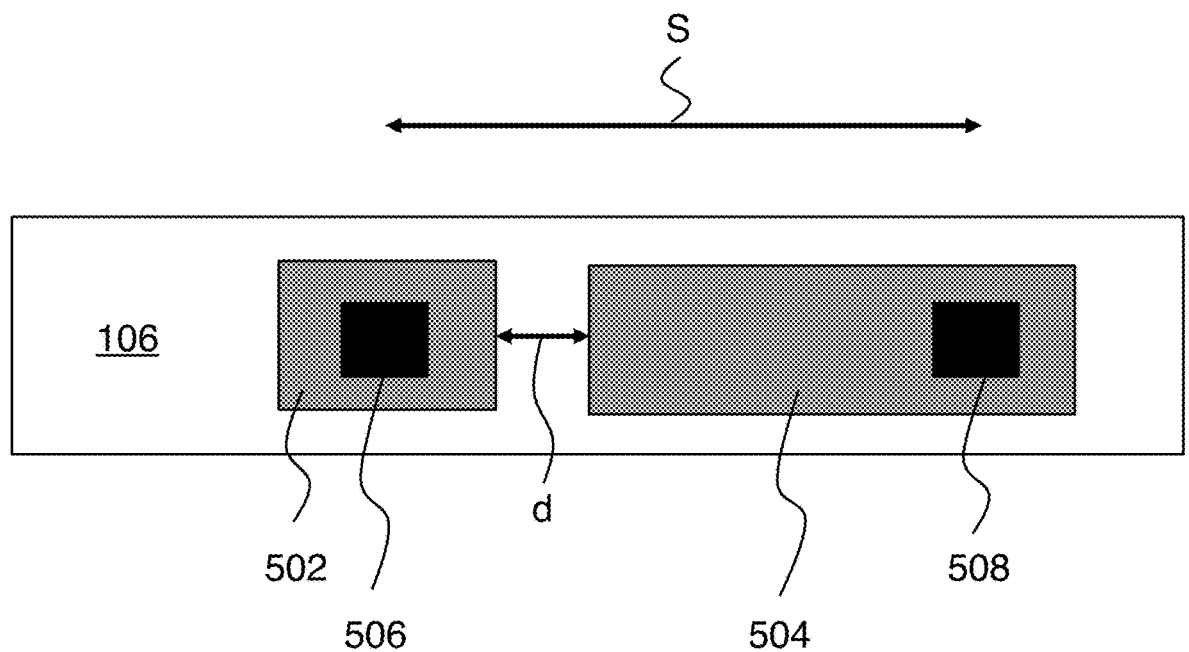

FIGS. 5A-B show an example of how embodiments of the invention can decouple electrical design from probe spacing. Here FIGS. 5A-B are top views of two probes having cores 506, 508 and shells 502, 504, respectively. The electrical properties of this pair of probes (e.g., transmission line impedance) are substantially determined by a geometrical configuration of the electrically conductive first members (502, 504) of the two probes. In particular the spacing d between the shells is an important parameter.

In contrast, the transmission line impedance of these two probes is substantially independent of the geometrical configuration of the mechanically resilient second members (506, 508) of the two probes. For example, the impedance is substantially independent of the core-to-core spacing S. Thus by having a first lateral size of the electrically conductive first members be substantially greater than a second lateral size of the mechanically resilient second members, as shown, the spacing between two cores can be altered without substantially affecting the transmission line impedance. Briefly, the transmission line impedances of the configurations of FIGS. 5A and 5B are substantially the same (i.e., to within 10% or less). Thus the probe spacing S can be set as needed to match the spacing of contact pads on the device under test without altering the electrical design of the probe array.

Figure 6:
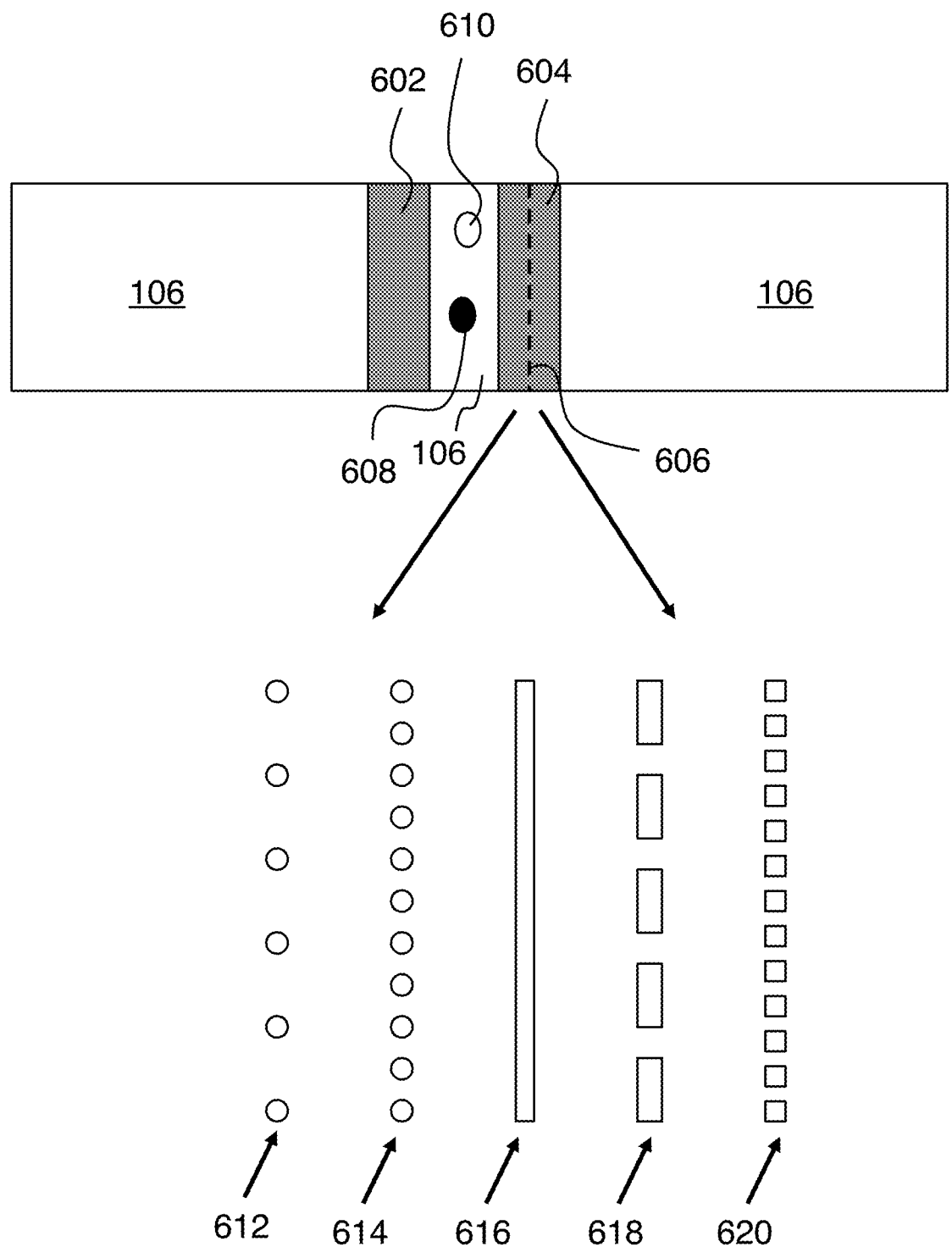
FIG. 6 shows optional features of some preferred embodiments.

FIG. 6 shows optional features of some preferred embodiments. This is a side view of two probes having shells 602 and 604 passing through guide plate 106. The effective dielectric constant between the two probes can be modified by disposing one or more voids 610 or inclusions 608 in the electrically insulating guide plate 106 between the two probes. This provides further degrees of design freedom in addition to the shell to shell spacing d of FIG. 1B. Another way to provide additional design freedom in this kind of probe architecture is to include one or more inductance control features 606 in the side walls of the shells. Here 612, 614, 616, 618, 620 show some examples of such inductance control features, which can be summarized as being holes or slots.

Figure 7D:
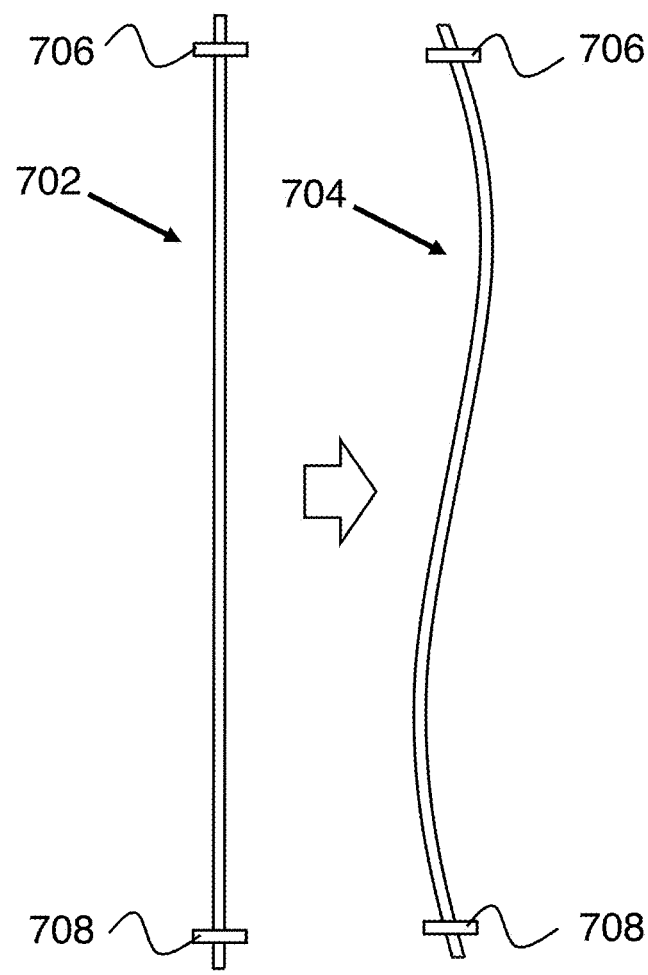
Figure 7E:
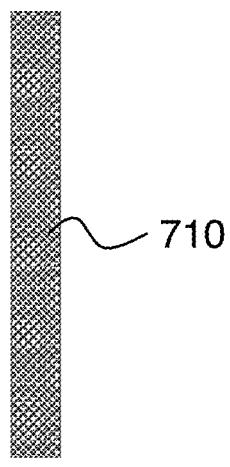
Figure 7F:
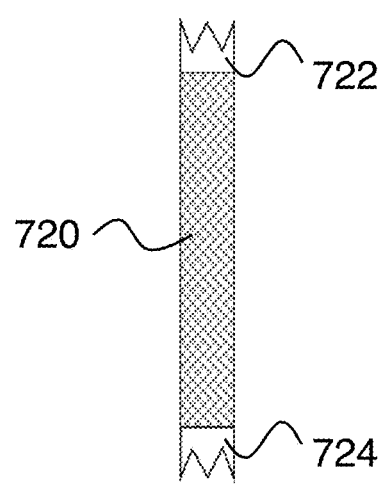

Practice of the invention does not depend critically on the configuration of the mechanically resilient second member. FIGS. 7A-E show some examples of suitable mechanically resilient second members. Here FIG. 7A shows a uniform repeating metal structure. FIG. 7B shows a uniform repeating metal structure having modified ends to improve sliding electrical contacts to the shell. FIG. 7C shows a non-uniform repeating metal structure for inherent retention in the shell. FIG. 7D shows a straight wire that can buckle under vertical compression to change from the configuration of 702 to the configuration of 704. Contact promoters 706, 708 (e.g., washers) can be disposed at the ends of the wire to improve sliding electrical contact to the shell. FIG. 7E shows an electrically conductive elastomer column 710. FIG. 7F shows an electrically insulating elastomer 720 having conductive metal tips 722 and 724.

Mechanically resilient probe cores can be fabricated using known technology, especially MEMS (microelectromechanical systems) probe technology. For example, a Cu/Ag core can be used for current carrying capacity and resistance control. Hard materials such as Rh can be used for probe tips. Various probe tip configurations can be used, depending on the device under test, such as pads, ball pillars, and use of other tip materials such as Al, Cu, Sn. Tabs or the like can be disposed on the cores to provide or improve retention of the cores in the shells. Simple, repeating designs can be used to more readily tune mechanical parameters such as contact force and over-travel. The vertical probe architecture inherently provides a small pitch. Long probes provide high over-travel, long lifetime and reduced susceptibility to particle damage. The buckling behavior of the cores can be a design parameter, with possibilities including in-plane buckling, out-of-plane buckling, and multiple nodes. Cores of this kind can easily be integrated into automated probe stitching machinery.

Figure 8A:
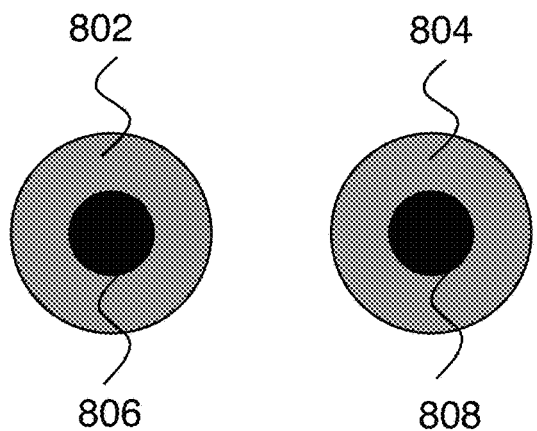
FIGS. 8A-C show some examples of suitable shell configurations.
Figure 8B:
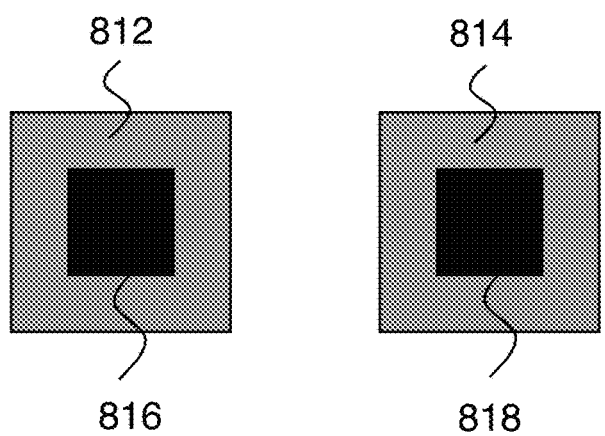
Figure 8C:
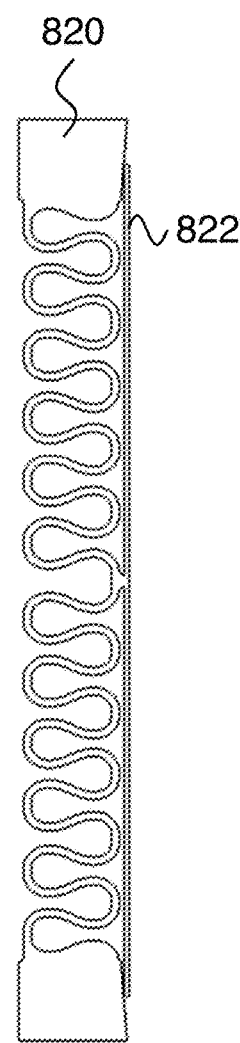

Practice of the invention does not depend critically on the configuration of the electrically conductive first member. FIGS. 8A-C show some examples of suitable configurations of the electrically conductive first member. As suggested by the core/shell terminology introduced above, in some preferred embodiments the electrically conductive first members are configured as shells substantially laterally surrounding the mechanically resilient second members. The two-probe configurations of FIGS. 8A-B (top views) provide some further examples. Here 802, 804, 812, 814 are the electrically conductive shells and 806, 808, 816, 818 are the mechanically resilient cores. However a core-shell configuration is not required. The example of FIG. 8C shows an electrically conductive first member 822 disposed adjacent to (but not laterally surrounding) a mechanically resilient first second member 820. Although the core and the shell are structurally distinct and provide separate functions, they can either be fabricated as separate parts (example of FIGS. 1A-B) or as a single part having both features, as in the example of FIG. 8C. Another fabrication option is to form the shells inside through holes in the guide plate, and then dispose the cores inside the shells to form the probes. Shells formed in this way can be single-layer structures or multi-layer structures.

Figure 9:
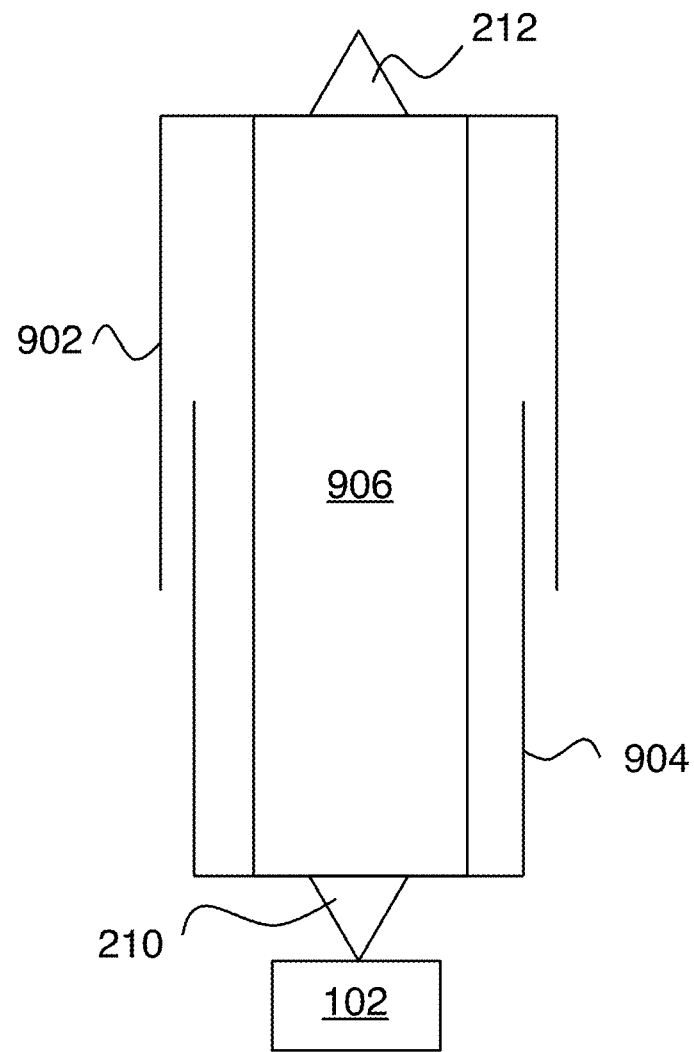
FIG. 9 schematically shows a conventional pogo-pin probe.

To better appreciate the present invention, it is helpful to contrast it with a conventional pogo-pin probe as shown on FIG. 9. Here 906 is the spring of the pogo-pin, which can be regarded as determining the tip to tip mechanical compliance of the pogo-pin probe. End caps 902 and 904 primarily serve to keep spring 906 mechanically isolated from other mechanical interference, and to keep spring 906 from interfering with other mechanisms (e.g., other pogo pins in an array). However, in sharp contrast to the preceding description, the dimensions of conventional pogo-pin probes are large enough that a decoupling of electrical and mechanical design as described above is simply unnecessary. Electrical current in pogo-pin probes flows mainly through spring 906 from end to end, and only incidentally through end caps 902, 904.

The invention claimed is:

1. A vertical probe array comprising:
one or more vertical probes;
wherein each of the one or more vertical probes comprises an electrically conductive first member and a mechanically resilient second member;
wherein each of the one or more vertical probes includes a first tip and a second tip disposed at opposite vertical ends of the probe;
wherein the first tip is configured to make temporary electrical contact to a device under test;
wherein the second tip is configured to make electrical contact to a test apparatus;
wherein an electrical current path from the first tip all the way to the second tip is primarily through the electrically conductive first member; and
wherein a mechanical compliance between the first tip and the second tip is primarily determined by the mechanically resilient second member.

2. The vertical probe array of claim 1, further comprising an electrically insulating guide plate through which the one or more vertical probes pass, wherein a transmission line impedance of a selected two of the vertical probes is primarily determined according to a distance between the selected two probes and according to an effective dielectric constant between the selected two probes.

3. The vertical probe array of claim 2, wherein the transmission line impedance is 50 Ω.

4. The vertical probe array of claim 2, wherein the transmission line impedance of the selected two probes is substantially determined by a geometrical configuration of the electrically conductive first members of the selected two probes.

5. The vertical probe array of claim 2, wherein the transmission line impedance of the selected two probes is substantially independent of a geometrical configuration of the mechanically resilient second members of the selected two probes.

6. The vertical probe array of claim 2, wherein the effective dielectric constant between the selected two probes is modified by disposing one or more voids or inclusions in the electrically insulating guide plate between the selected two probes.

7. The vertical probe array of claim 2,
wherein a first lateral size of the electrically conductive first members is substantially greater than a second lateral size of the mechanically resilient second members;
whereby a spacing between the selected two probes can be altered without substantially affecting the transmission line impedance.

8. The vertical probe array of claim 1,
wherein the first and second tips are disposed on the mechanically resilient second member;
wherein the electrically conductive first member is configured to make a first sliding electrical contact in proximity to the first tip; and
wherein the electrically conductive first member is configured to make a second sliding electrical contact in proximity to the second tip.

9. The vertical probe array of claim 1,
wherein the first tip is disposed on the mechanically resilient second member;
wherein the second tip is disposed on the electrically conductive first member;
wherein the electrically conductive first member is configured to make a first sliding electrical contact in proximity to the first tip.

10. The vertical probe array of claim 9, wherein an electrically insulating mechanical connection between the electrically conductive first member and the mechanically resilient second member is disposed in proximity to the second tip.

11. The vertical probe array of claim 1,
wherein the second tip is disposed on the mechanically resilient second member;
wherein the first tip is disposed on the electrically conductive first member;
wherein the electrically conductive first member is configured to make a second sliding electrical contact in proximity to the second tip.

12. The vertical probe array of claim 11, wherein an electrically insulating mechanical connection between the electrically conductive first member and the mechanically resilient second member is disposed in proximity to the first tip.

13. The vertical probe array of claim 1, wherein the electrically conductive first members are configured as shells substantially laterally surrounding the mechanically resilient second members.

14. The vertical probe array of claim 13, wherein the electrically conductive first members each include one or more inductance control features disposed in side walls of the shells and selected from the group consisting of: holes and slots.

15. The vertical probe array of claim 1, wherein the electrically conductive first member is configured as a shell, and wherein the mechanically resilient second member is configured as a core laterally surrounded by the shell.

* * * * *